US010996561B2

(12) United States Patent
Bamesberger et al.

(10) Patent No.: US 10,996,561 B2
(45) Date of Patent: May 4, 2021

(54) NANOIMPRINT LITHOGRAPHY WITH A SIX DEGREES-OF-FREEDOM IMPRINT HEAD MODULE

(71) Applicant: CANON KABUSHIKI KAISHA, Tokyo (JP)

(72) Inventors: Seth J. Bamesberger, Austin, TX (US); Jeremy Sevier, Austin, TX (US); Byung-Jin Choi, Austin, TX (US); Philip D. Schumaker, Austin, TX (US); Mario Johannes Meissl, Austin, TX (US)

(73) Assignee: CANON KABUSHIKI KAISHA, Tokyo (JP)

( * ) Notice: Subject to any disclaimer, the term of this patent is extended or adjusted under 35 U.S.C. 154(b) by 157 days.

(21) Appl. No.: 15/854,269

(22) Filed: Dec. 26, 2017

(65) Prior Publication Data

US 2019/0196324 A1 Jun. 27, 2019

(51) Int. Cl.
*G03F 7/00* (2006.01)
*B29C 43/58* (2006.01)
*B29C 43/02* (2006.01)

(52) U.S. Cl.
CPC .......... *G03F 7/0002* (2013.01); *B29C 43/021* (2013.01); *B29C 43/58* (2013.01)

(58) Field of Classification Search
None
See application file for complete search history.

(56) References Cited

U.S. PATENT DOCUMENTS

| 4,516,253 A | 5/1985 | Novak |
| 5,263,382 A | 11/1993 | Brooks |
| 5,752,834 A | 5/1998 | Ling |
| 5,901,936 A | 5/1999 | Bieg |
| 6,353,271 B1 | 3/2002 | Williams |

(Continued)

FOREIGN PATENT DOCUMENTS

| JP | 2011-512019 A | 4/2011 |
| JP | 2016-192543 A | 11/2016 |
| JP | 2017-157639 A | 9/2017 |

OTHER PUBLICATIONS

Yue et al, Relationship Among Input-Force, Payload, Stiffness, and Displacement of a 6-DOF Perpendicular Parallel, J. Mechanisms Robotics. Feb. 2010, 2(1): 011007 (Year: 2010).*

(Continued)

*Primary Examiner* — Timothy Kennedy
(74) *Attorney, Agent, or Firm* — Canon U.S.A., Inc. IP Division

(57) ABSTRACT

A head module of an imprint lithography system includes a base, a control body coupled to the base, a first set of actuators configured to generate a first force to translate the control body relative to the base along a first axis and to rotate the control body relative to the base about a second axis perpendicular to the first axis and about a third axis perpendicular to the first axis and to the second axis, a second set of actuators configured to generate a second force to translate the control body relative to the base in a plane defined by the second axis and the third axis and to rotate the control body relative to the base about the first axis, and a flexure coupling the base and the control body and restricting translation and rotation of the control body with respect to the base.

17 Claims, 8 Drawing Sheets

(56) References Cited

U.S. PATENT DOCUMENTS

| | | |
|---|---|---|
| 6,437,463 B1 | 8/2002 | Hazelton |
| 6,477,912 B2 | 11/2002 | Song |
| 6,840,127 B2 | 1/2005 | Moran |
| 6,873,087 B1 | 3/2005 | Choi |
| 6,916,584 B2 | 7/2005 | Sreenivasan |
| 6,916,585 B2 | 7/2005 | Sreenivasan |
| 6,932,934 B2 | 8/2005 | Choi |
| 7,027,156 B2 | 4/2006 | Watts |
| 7,157,036 B2 | 1/2007 | Choi |
| 7,170,589 B2 | 1/2007 | Cherala |
| 7,298,456 B2 | 11/2007 | Cherala |
| 7,420,654 B2 | 9/2008 | Cherala |
| 7,728,462 B2 | 6/2010 | Williams |
| 7,815,424 B2 | 10/2010 | Nakamura |
| 8,387,482 B2 | 3/2013 | Choi |
| 8,599,361 B2 | 12/2013 | Zhu |
| 2004/0124566 A1 | 7/2004 | Sreenivasan |
| 2004/0188381 A1 | 9/2004 | Sreenivasan |
| 2004/0211754 A1 | 10/2004 | Sreenivasan |
| 2005/0187339 A1 | 8/2005 | Xu |
| 2006/0033043 A1 | 2/2006 | Arai |
| 2008/0024749 A1 | 1/2008 | Williams |
| 2008/0160129 A1* | 7/2008 | Resnick ............... G03F 7/0002 425/385 |
| 2010/0187917 A1 | 7/2010 | Zhu |
| 2014/0151947 A1 | 6/2014 | Brown |

OTHER PUBLICATIONS

Hexapod 6-Axis Parallel Kinematics Positioning Systems, Stewart Platforms, 6-DOF Motion Platforms—PI, retrieved on Sep. 29, 2017, from < http://www.pi-usa.us/products/Micropositioning_Stage_Hexapod/hexapod-6-axis-stage.php>, 12 pages.

6-Axis Miniature Hexapod—PI, retrieved from <http://www.pi-usa.us/products/PDF_Data/810_Hexapod_Platform_Parallel_Positioner> May 22, 2012, 7 pages.

6-Axis Hexapod—Newport, retrieved from <https://www.newport.com/f/hxp-series-hexapods?xcid=googppc-1046&gclid=CPr9i6Wihc4CFQIGaQodKwoNQQ> on Feb. 12, 2019, 7 pages.

Hexapod 6DOF Positioning System—Aerotech, retrieved from <http://www.aerotech.com/productcatalog/hexapods.aspx> on Feb. 12, 2019, 2 pages.

Wen et al. "Design of a fine alignment system featuring active orientation adjustment for nano imprint lithography." Review of Scientific Instruments; Mar. 2014, vol. 85, Issue 3, 035106-1-10.

Shalom D. Ruben et al. "Motion Control for Nano Lithography." ASPE Proceeding, Spring 2008, 6 pages.

* cited by examiner

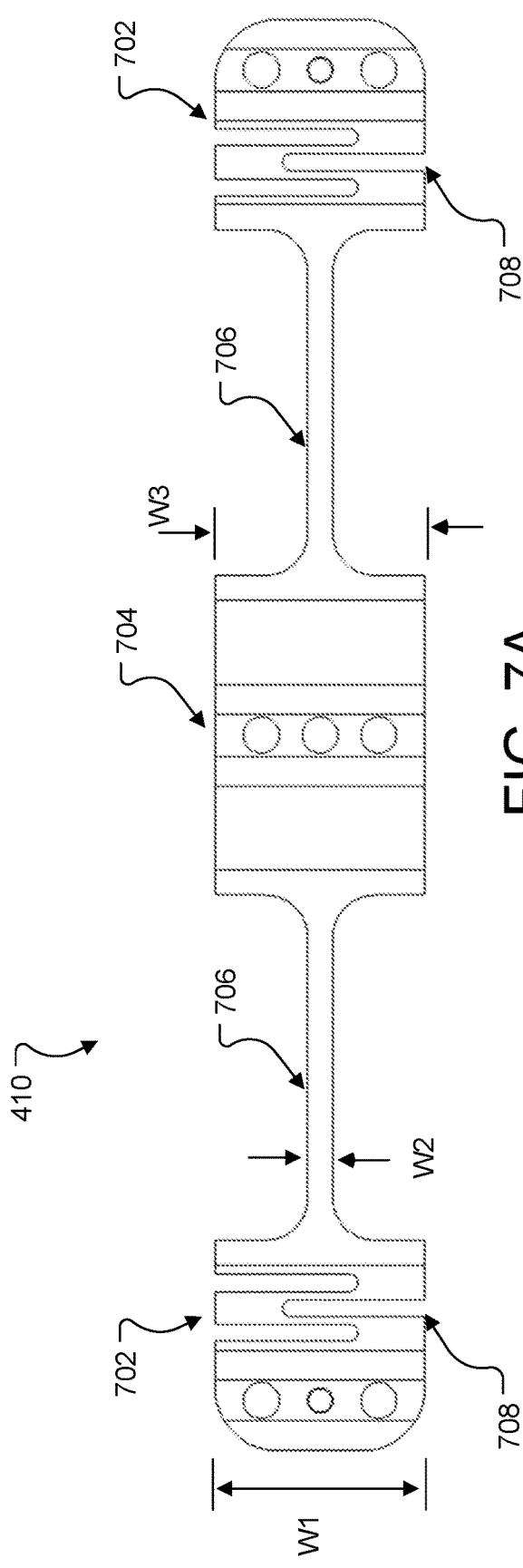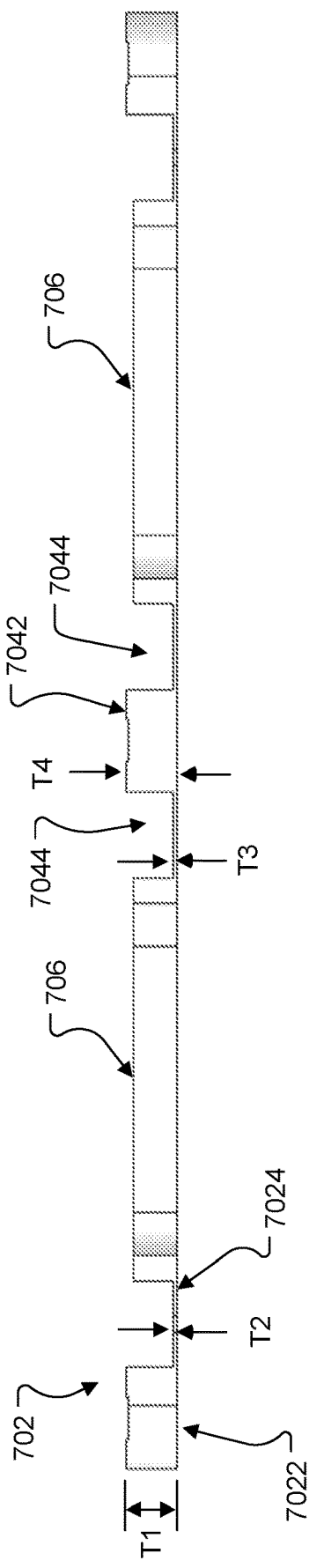
FIG. 7A
FIG. 7B

NANOIMPRINT LITHOGRAPHY WITH A SIX DEGREES-OF-FREEDOM IMPRINT HEAD MODULE

TECHNICAL FIELD

The disclosure relates to nanoimprint lithography, more particularly to an imprint head module with six degrees of freedom.

BACKGROUND

In nanoimprint lithography, techniques for field to field alignment have been used to achieve nanometer level overlay accuracy. In some examples, an alignment error between an imprint template and a corresponding field on a substrate can be corrected by moving a stage retaining the substrate relative to an imprint head module retaining the template. Alignment methods for nanoimprint lithography are described in detail in numerous publications, such as U.S. Pat. Nos. 8,387,482, 7,027,156, and 6,916,584, all of which are incorporated by reference herein. An alignment speed and accuracy in the related art are limited by a compliance of the stage and non-linear dynamics between the template and the substrate that has a liquid imprint resist on top. For example, the liquid imprint resist may cause a shear force acting on the stage during the field to field alignment and result in a discrepancy between a target displacement and an actual displacement of the template relative to the substrate due to a compliance of the stage.

SUMMARY

According to one aspect of the subject matter disclosed in this application, a head module of an imprint lithography system includes a base, a control body coupled to the base and configured to translate and to rotate relative to the base, a first set of actuators operatively coupled to the base and to the control body, a second set of actuators operatively coupled to the base and to the control body, and a flexure coupling the base and the control body. The first set of actuators is configured to generate a first force to translate the control body relative to the base along a first axis and to rotate the control body relative to the base about a second axis perpendicular to the first axis and about a third axis perpendicular to the first axis and to the second axis. The second set of actuators is configured to generate a second force to translate the control body relative to the base in a plane defined by the second axis and the third axis and to rotate the control body relative to the base about the first axis. A compliance of the flexure corresponds to a displacement of the control body relative to the base in response to at least one of the first force and the second force, and the flexure is configured to restrict translation and rotation of the control body with respect to the base.

Implementations according to this aspect may include one or more of the following features. For example, the compliance of the flexure includes a first component corresponding to a displacement of the control body relative to the base along the first axis in response to the first force, and a second component corresponding to a displacement of the control body relative to the base in the plane defined by the second axis and the third axis in response to the second force. The first component of the compliance exceeds the second component of the compliance.

In some implementations, the flexure is arranged in a plane perpendicular to the first axis and includes end portions coupled to a surface of the base, a middle portion located between the end portions and coupled to a surface of the control body, and connection portions, each connection portion coupled to the middle portion and one of the end portions. In this case, a width of each connection portion is less than a width of each end portion and less than a width of the middle portion in the plane perpendicular to the first axis.

In some examples, each end portion of the flexure defines an opening configured to provide at least a portion of the compliance. For example, each end portion includes a first portion coupled to the surface of the base, and a second portion located between the first portion and one of the connection portions. The second portion defines the opening, and a thickness of the second portion is less than a thickness of the first portion in a direction parallel to the first axis. The middle portion includes a protrusion extending parallel to the first axis between recesses, and the protrusion is coupled to the surface of the control body.

In some implementations, the first set of actuators includes three first actuators arranged about a central axis of the base, where the central axis is parallel to the first axis. In some examples, the three first actuators are equally spaced about the central axis of the base and configured to independently translate and rotate the control body relative to the base. Similarly, in some implementations, the second set of actuators includes three second actuators arranged about a central axis of the base, wherein the central axis is parallel to the first axis. In some examples, the three second actuators are equally spaced about the central axis of the base and configured to independently translate and to rotate the control body relative to the base.

In some implementations, pairs of actuators, where each pair includes an actuator of the first set of actuators and an actuator of the second set of actuators, are arranged about a central axis of the base, where the central axis is parallel to the first axis. Each actuator of the pairs of actuators is configured to independently translate the control body relative to the base and to rotate the control body relative to the base.

In some examples, each actuator of the first and second sets of actuators includes a voice coil configured to generate a force based on an electric current supplied to each actuator. For example, the voice coil includes a moving coil coupled to one of the control body and the base, and a magnet coupled to the other of the control body and the base.

In some examples, the head module further includes a plurality of encoder units coupled to at least one of the base or the control body. In this example, each encoder unit is configured to assess a first displacement of the control body relative to the base along the first axis and a second displacement of the control body relative to the base in the plane defined by the second axis and the third axis. Each encoder unit includes encoders coupled to the base, arranged in a plane parallel to the first axis, and inclined with respect to the first axis. Each encoder unit may further include an encoder scale coupled to the control body, and the encoders are configured to emit light toward the encoder scale and to receive diffracted light from the encoder scale. The encoder scale includes an optical grating configured to diffract the light emitted by the encoder unit based on a period of the optical grating and a wavelength of the light. Each encoder unit is configured to assess the first displacement and the second displacement of the control body relative to the base based on the diffracted light from the optical grating.

In some implementations, the control body is configured to retain an imprint lithography template. The first set of actuators is further configured to translate and to rotate the control body relative to the base to cause the imprint lithography template to contact a substrate, and the second set of actuator is further configured to translate and to rotate the control body relative to the base to align the imprint lithography template to the substrate. In some examples, the head module further includes one or more displacement sensors configured to assess a template placement error of the imprint lithography template relative to the control body. The first and second sets of actuators are further configured to translate and to rotate the control body based on the template placement error of the template relative to the control body.

According to another aspect of the subject matter, an imprint lithography system includes a substrate stage configured to retain a substrate, an imprint head module configured to retain a template and to translate the template relative to the substrate. The imprint head module includes a base, a control body coupled to the base and configured to translate and to rotate relative to the base, a first set of actuators operatively coupled to the base and to the control body, a second set of actuators operatively coupled to the base and to the control body, and a flexure coupling the base and the control body. The first set of actuators is configured to generate a first force to translate the control body relative to the base along a first axis and to rotate the control body relative to the base about a second axis perpendicular to the first axis and about a third axis perpendicular to the first axis and to the second axis. The second set of actuators is configured to generate a second force to translate the control body relative to the base in a plane defined by the second axis and the third axis and to rotate the control body relative to the base about the first axis. A compliance of the flexure corresponds to a displacement of the control body relative to the base in response to at least one of the first force and the second force, and the flexure is configured to restrict translation and rotation of the control body with respect to the base.

According to another aspect of the subject matter, an imprint lithography alignment method includes dispensing an imprint resist on a substrate, contacting the imprint resist with a template that is mounted on an imprint head module, assessing an alignment error between the template and the substrate, and adjusting the alignment error based on a six degrees-of-freedom movement of the imprint head module relative to the substrate corresponding to the translation error and the angular error. The imprint resist is a liquid, and the alignment error includes a translation error in a direction along at least one of three orthogonal axes and an angular error about at least one of the three orthogonal axes.

Implementations according to this aspect may include one or more of the following features. For example, adjusting the alignment error includes adjusting the alignment error based on at least one of a movement of the substrate relative to the template and the six degrees-of-freedom movement of the imprint head module relative to the substrate. In some examples, adjusting the alignment error includes determining an axis of the three orthogonal axes corresponding to the angular error, and adjusting the angular error by rotating the imprint head about the determined axis. Adjusting the alignment error may further includes adjusting the angular error by rotating the imprint head about a central axis of the template parallel to a first axis of the three orthogonal axes. In some examples, the method further includes assessing a template placement error between the template and the imprint head module, where adjusting the alignment error includes adjusting the template placement error.

In some implementations, the method further includes orienting the template relative to the substrate based on movement of the imprint head module or the substrate before contacting the imprint resist with the template. The orienting step may include adjusting a distance along a first axis among the three orthogonal axes, and rotating the template relative to the substrate about a second axis or a third axis that are each orthogonal to the first axis.

The details of one or more implementations of the subject matter described in this specification are set forth in the accompanying drawings and the description below. Other potential features, aspects, and advantages of the subject matter will become apparent from the description, the drawings, and the claims.

DESCRIPTION OF DRAWINGS

FIG. 7A is a top view of a flexure of the imprint head module of FIG. 4.

FIG. 7B is a side view of the flexure of the imprint head module of FIG. 4

DETAILED DESCRIPTION

Figure 1:
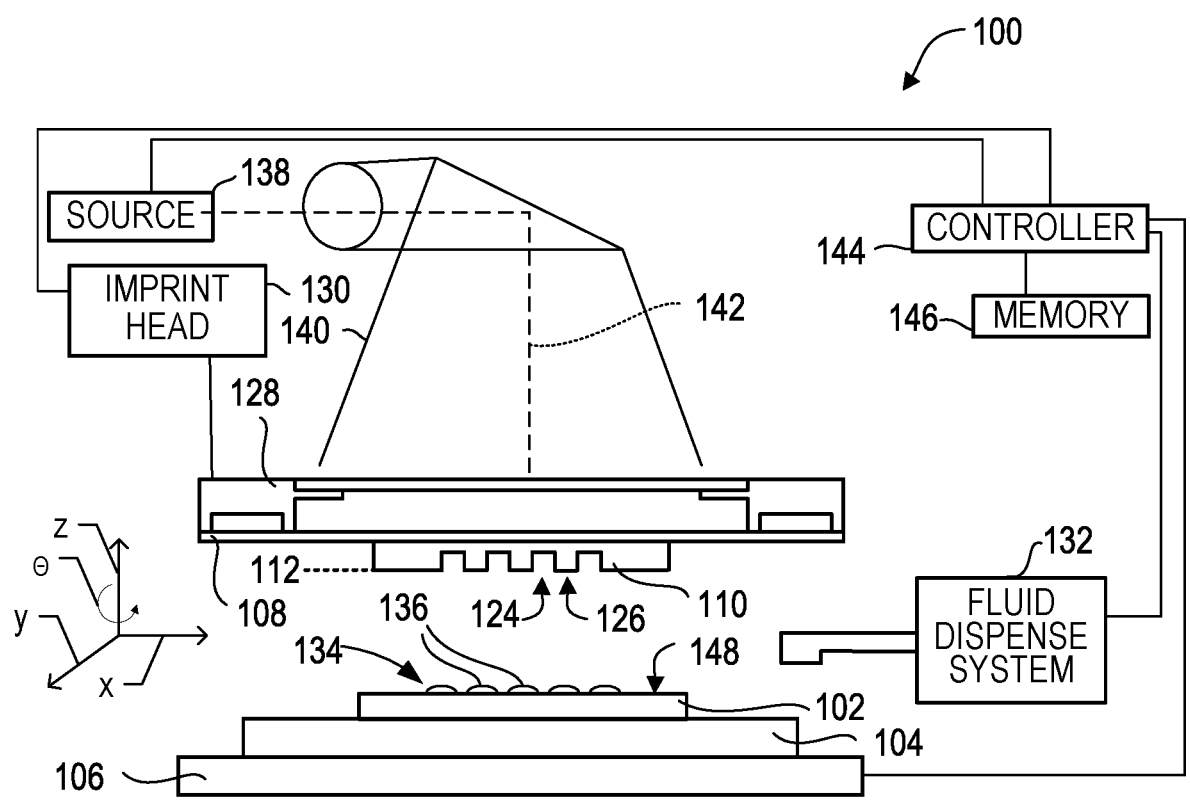
FIG. 1 is a side view of a nanoimprint lithography system.

FIG. 1 illustrates an imprint lithography system 100 that forms a relief pattern on a substrate 102. The substrate 102 may be coupled to a substrate chuck 104. In some examples, the substrate chuck 104 includes a vacuum chuck, a pin-type chuck, a groove-type chuck, an electromagnetic chuck, or other appropriate chuck. Exemplary chucks are described in U.S. Pat. No. 6,873,087, which is hereby incorporated by reference herein. The substrate 102 and the substrate chuck 104 may be further supported by a stage 106. The stage 106 provides motion about the x- and y-axes as well as rotation (e.g., Θ) about the z-axis. The stage 106, the substrate 102, and the substrate chuck 104 may also be positioned on a base (not shown).

The imprint lithography system 100 includes an imprint lithography template 108 that is spaced apart from the substrate 102. In some examples, the template 108 includes a mesa 110 (mold 110) that extends from the template 108 toward the substrate 102. In some examples, the mold 110 includes a patterning surface 112. Alternatively, template 108 may be formed without mesa 110 and/or with a blank (unpatterned) surface. The template 108 and/or the mold 110 may be formed from such materials including, but not limited to, fused-silica, quartz, silicon, organic polymers, siloxane polymers, borosilicate glass, fluorocarbon polymers, metal, hardened sapphire, or other appropriate material. In the illustrated example, the patterning surface 112 includes a plurality of features defined by spaced-apart recesses 124 and protrusions 126. However, in some examples, other configurations of features are possible. The patterning surface 112 may define any pattern that forms the basis of a pattern to be formed on substrate 102.

The template 108 may be coupled to a template chuck 128. In some examples, the template chuck 128 includes a vacuum chuck, a pin-type chuck, a groove-type chuck, an electromagnetic chuck, or any appropriate chuck. Exemplary chucks are described in U.S. Pat. No. 6,873,087. Further, the template chuck 128 may be coupled to an imprint head 130 such that the template chuck 128, the imprint head 130, or both are configured to facilitate movement of the template 108. Movement of the template 108 includes movement in the plane of the template (in-plane movement) and movement out of the plane of the template (out-of-plane movement) with respect to the template. In-plane movement includes translation of the template 108 in the plane of the template (e.g., in the X-Y plane as depicted in FIG. 1) and rotation of the template in the plane of the template (e.g., in the X-Y plane and about the Z axis). In other examples, translation or rotation of the template 108 with respect to the substrate 102 can also be achieved by translation or rotation of the substrate 102 or both of the template 108 and the substrate 102.

In-plane movement of the template 108 also includes increasing or decreasing a compression force on opposite sides of the template (e.g., with a magnification actuator) to increase or decrease dimensions of the template in the X-Y plane of the template. Out-of-plane movement of the template 108 includes translation of the template along the Z-axis (e.g., to increase or decrease a force applied to the substrate via the template by increasing or decreasing the distance between the template and the substrate) and rotation of the template about an axis in the X-Y plane of the template. Rotation of template 108 about an axis in the X-Y plane of the template changes an angle between the X-Y plane of the template 108 and the X-Y plane of substrate 102, and is referred herein to as "tilting" the template with respect to the substrate, or changing a "tilt" or "tilt angle" of the template with respect to the substrate. U.S. Pat. No. 8,387,482 discloses movement of a template via an imprint head in an imprint lithography system, and is incorporated by reference herein.

The imprint lithography system 100 may further include a fluid dispense system 132. The fluid dispense system 132 may be used to deposit a polymerizable material 134 on the substrate 102. The polymerizable material 134 may be disposed on the substrate 102 using techniques such as drop dispense, spin-coating, dip coating, chemical vapor deposition (CVD), physical vapor deposition (PVD), thin film deposition, thick film deposition, or other appropriate method. In some examples, the polymerizable material 134 is disposed on the substrate 102 before or after a desired volume is defined between the mold 110 and the substrate 102. The polymerizable material 134 may include monomers as described in U.S. Pat. No. 7,157,036 and U.S. Patent Application Publication No. 2005/0187339, both of which are incorporated by reference herein. In some examples, the polymerizable material 134 is disposed on the substrate 102 as a plurality of droplets 136.

Referring to FIG. 1, the imprint lithography system 100 may further include an energy source 138 coupled to direct energy 140 along a path 142. In some examples, the imprint head 130 and the stage 106 are configured to position the template 108 and the substrate 102 in superimposition with the path 142. The imprint lithography system 100 may be regulated by a controller 144 in communication with the stage 106, the imprint head 130, the fluid dispense system 132, the energy source 138, or any combination thereof, and may operate on a computer readable program stored in a memory 146.

In some examples, the imprint head 130, the stage 106, or both, vary a distance between the mold 110 and the substrate 102 to define a desired volume therebetween that is filled by the polymerizable material 134. For example, the imprint head 130 may apply a force to the template 108 such that the mold 110 contacts the polymerizable material 134. After the desired volume is filled by the polymerizable material 134, the energy source 138 produces energy 140, such as broadband ultraviolet radiation, causing the polymerizable material 134 to polymerize and to conform to the shape of a surface 148 of the substrate 102 and the patterning surface 112 of template 108, defining a polymeric layer on the substrate 102.

The above-described system and process may be further implemented in imprint lithography processes and systems referred to in U.S. Pat. No. 6,932,934, U.S. Patent Application Publication No. 2004/0124566, U.S. Patent Application Publication No. 2004/0188381, and U.S. Patent Application Publication No. 2004/0211754, all of which are incorporated by reference herein.

Imprint lithography substrates and templates may include corresponding pairs of alignment marks that allow real-time alignment of the template and the substrate. After the patterned template is positioned over the substrate (e.g., superimposed over the substrate), an alignment of the template alignment marks with respect to the substrate alignment marks is determined. Alignment schemes may include "through the mask" (TTM) measurement of alignment errors associated with pairs of corresponding alignment marks, followed by compensation of these errors to achieve accurate alignment of the template and a desired imprint location on the substrate as disclosed in U.S. Pat. Nos. 6,916,585; 7,170,589; 7,298,456; and 7,420,654, all of which are incorporated by reference herein. Alignment errors may be caused by relative positioning of the substrate and the template, deformation of the substrate or the template, or a combination thereof.

Figure 2:
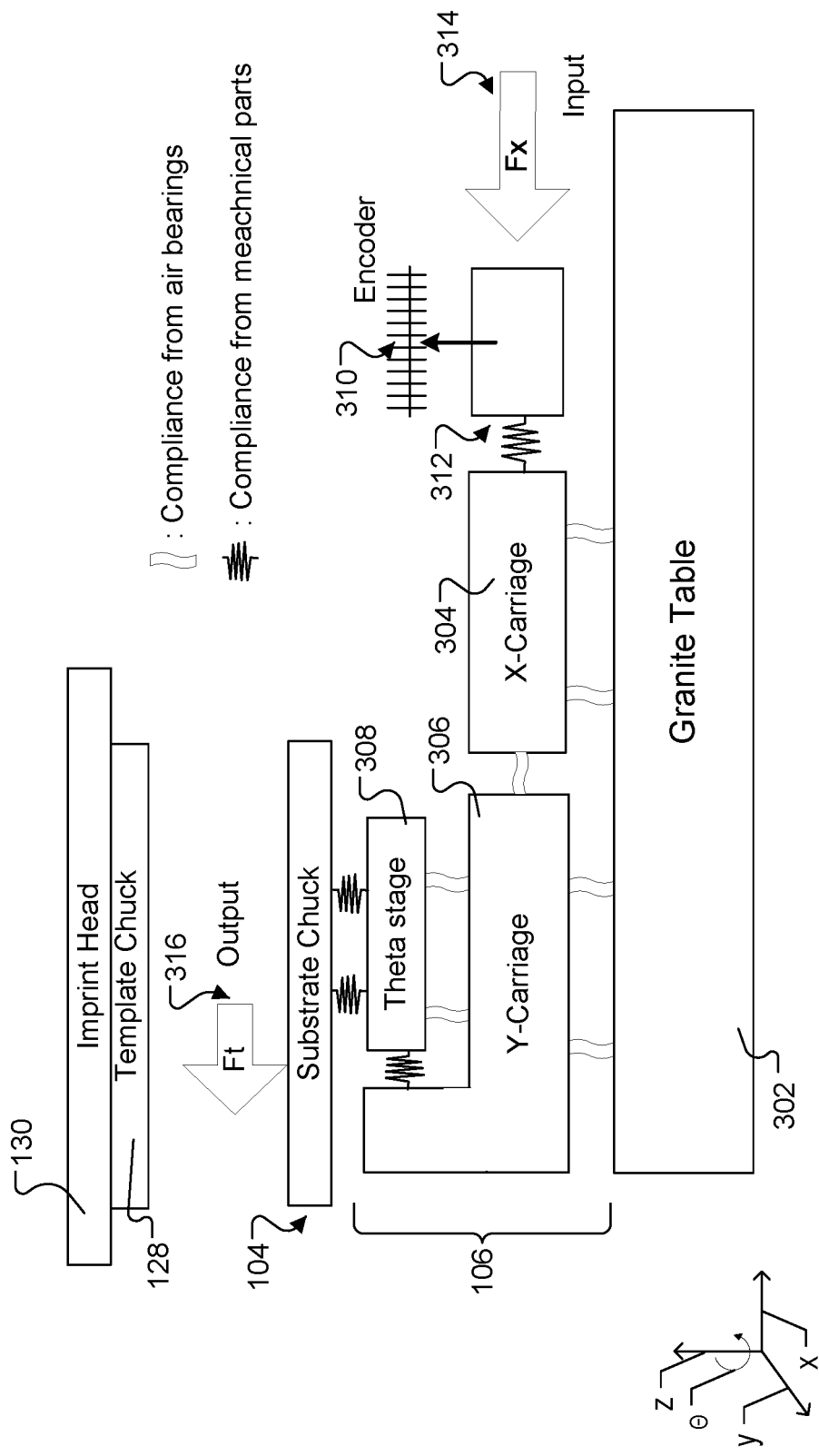
FIG. 2 depicts a conceptual stage stack of a substrate stage, depicting compliances that may exist in the stage stack.

FIG. 2 illustrates a conceptual stage stack of an example stage 106 and visualizes example compliances that may exist between components of the stage stack. The stage 106 includes one or more linear carriages 304, 306, and a rotational stage 308 that are built on a table 302. For example, the table 302 is a granite table that can serve as a reference block with stability and endurance. The table 302 supports the linear carriages 304, 306, and the rotational stage 308 and serves as a reference frame of movement of the linear carriages 304, 306, and the rotational stage 308. For example, the linear carriage 304 ("X-carriage") may translate along the X axis relative to the table 302, the linear carriage 306 ("Y-carriage") may translate along the Y axis relative to the table 302, and the rotational stage 308 ("theta stage") may rotate about the Z axis relative to the table 302, as depicted in FIG. 2. The stage 106 may further include a measurement device such as a stage encoder 310 configured to assess these translations of the linear carriages 304, 306 with respect to a reference frame (e.g., encoder scale).

In some examples, the linear carriages 304, 306, and the rotational stage 308 are built on one another. For example, the rotational stage 308 may be built on the Y-carriage 306, and translate together with the Y-carriage 306 along the Y axis, as depicted in FIG. 2. In other examples, the Y-carriage 306 is built on the X-carriage 304 and translates together with the X-carriage 304 along the X axis relative to the table 302. A substrate chuck 104 configured to retain a substrate may be coupled to one of the rotational stage 308 or the linear carriages 304, 306. In one example, as depicted in FIG. 2, the substrate chuck 104 is coupled to the rotational stage 308 and can translate and rotate relative to a template chuck 128 as a result of translation of the linear carriages 304, 306 and rotation of the rotational stage 308 relative to the table 302.

In some examples, the linear carriages 304, 306 and the rotational stage 308 are supported and connected by air bearings or by other mechanical elements (e.g., bearings, linear guides, and mechanical beams, etc.) to guide movements of the linear carriages 304, 306 and the rotational stage 308 and to reduce friction during the movements. For example, the stage 106 may include first air bearings that are provided between the linear carriages 304, 306 and the table 302, and second air bearings that are provided between the linear carriages 304,306. The first and second air bearings may guide translation of linear carriages 304, 306 relative to the table 302 and reduce friction during the translation. In some examples, the rotational stage 308 is supported by third air bearings provided between the linear carriage 306 and the rotational stage 308. The rotational stage 308 may be further supported by a mechanical bearing configured to facilitate rotation of the rotational stage 308 about an axis (e.g., Z axis) and to reduce friction during the rotation.

In some implementations, movement of the stage 106 as a result of movements of components of the stage 106 (e.g., linear carriages 304, 306, and rotational stage 308) is affected by compliances of the components, connection elements (e.g., air bearings, bearings, springs, dampers, and other mechanical elements) that connect the components, and a liquid interface between the substrate 102 and the template 108. A compliance of the component may correspond to a displacement of the component in response to a force applied to the component to cause the displacement. For example, the compliance may be a ratio of a displacement over an input force and may be measured in units of meters per newton. In some cases, the compliance is defined according to a direction of the input force and a displacement of the component in the direction. For example, an x-compliance of the stage 106 may correspond to a displacement of the substrate chuck 104 along the X axis relative to the table 302 in response to an input force Fx 314 applied to the X-carriage 304 in a direction parallel to the X axis.

In some examples, the input force Fx 314 is applied by a stage actuator 312 that is connected to the X-carriage 304 (e.g., via a mechanical beam) to cause a translation of the substrate chuck 104 by a target displacement relative to the template chuck 128. In this case, a resulting force Ft 316 at the substrate chuck 104 may be less than the input force Fx 314 because of compliances of air bearings and mechanical elements as described above. Thus, a resulting displacement of the substrate chuck 104 based on the resulting force Ft 316 may be less than the target displacement. In some examples, the resulting displacement of the substrate chuck 104 is delayed from a time that the input force Fx 314 has been applied to the X-carriage 304.

The discrepancy between the resulting displacement from the target displacement and the delayed displacement over a tolerable time delay may limit a precise control of the stage 106 and an alignment throughput or speed. For example, if an alignment error between the substrate 102 and the template 108 includes a translation error 50 nm in an X or Y direction and an angular error 1 mrad about the Z axis, the stage 106 may have to move more than the alignment error to account for the stage compliance. Typically, how much more the stage 106 needs to move to correct the alignment error is not repeatable and may depend on other variables such as a field location in the substrate 102. In some examples, the stage encoders 310 are located at a position in plane with the stage actuators 312 to access displacements of the stage 106. In this case, since the stage encoders 310 access the displacements of the stage 106 at a location far from a substrate/template interface, it may be difficult to provide an accurate measurement to quickly correct the alignment error due to the stage compliance.

In some implementations, an imprint head 130 controls the template chuck 128 in six degrees of freedom to move the template 108 retained by the template chuck 128 relative to the substrate 102. For instance, a six degrees-of freedom movement of the imprint head 130 may include translation along the X axis, translation along the Y axis, translation along the Z axis, rotation about the X axis (Rx), rotation about the Y axis (Ry), and rotation about the Z axis (Rz) relative to the substrate 102. In examples where the imprint head 130 can move the template 108 in six degrees of freedom relative to the substrate 102, an alignment error between the template 108 and the substrate 102 may be corrected by moving the imprint head 130, which may avoid the limitations in the alignment accuracy and speed due the stage compliance described above. In some examples, the imprint head 130 includes a measurement device (e.g., optical encoder) that can assess displacements of the template 108 at a location close to the substrate/template interface. Controlling the imprint head 130 in six degrees of freedom promotes a high alignment speed and a high throughput (e.g., >20 wafer/hour).

Figure 3:
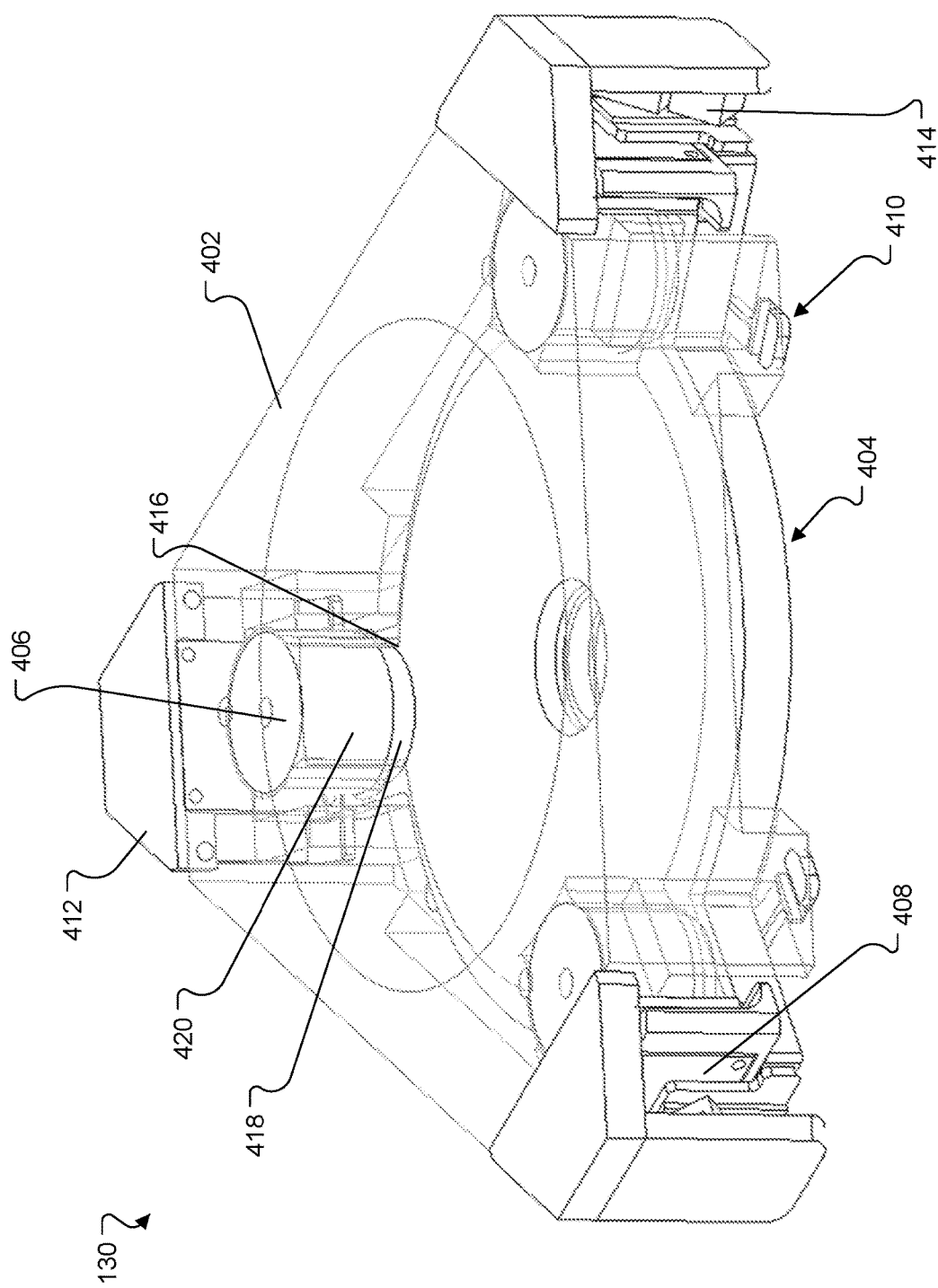
FIG. 3 is a perspective view of an imprint head module.
Figure 4:
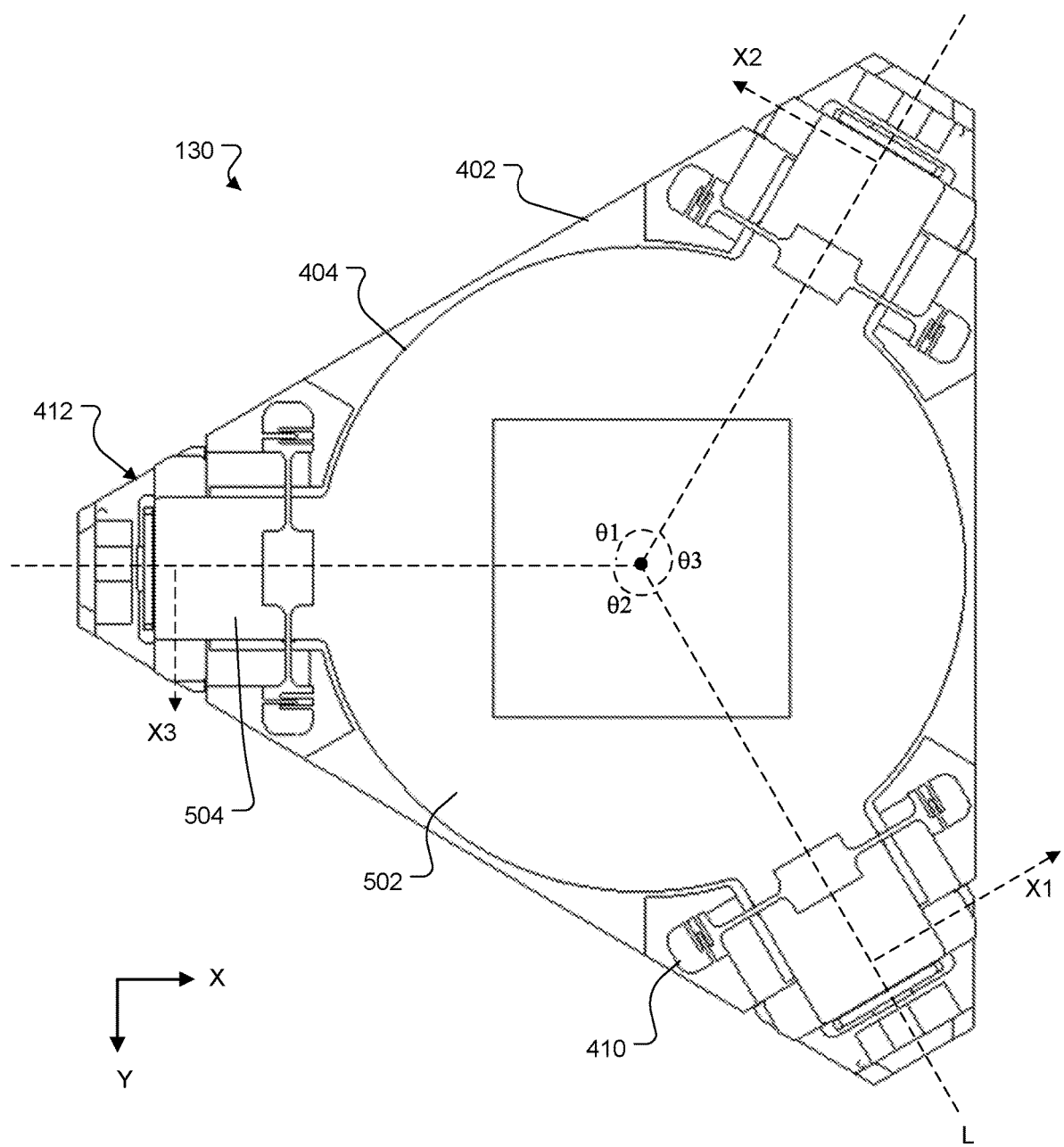
FIG. 4 is a bottom view of the imprint head module of FIG. 3, showing three pairs of actuators spaced about a central axis of a base of the imprint head module.

FIGS. 3 and 4 illustrate a perspective view and a bottom view, respectively, of an example imprint head 130. The imprint head module 130 includes a base 402, a control body 404 that is coupled to the base 402 and that is configured to translate and to rotate relative to the base 402, a first set of actuators 406 operatively coupled to the base 402 and to the control body 404, a second set of actuators 408 operatively coupled to the base 402 and to the control body 404, and a flexure 410 that couples the base 402 and the control body 404. A template chuck 128 (see FIG. 1) may be coupled to the control body 404 and move together with the control body. For example, the template chuck 128 translates relative to the base 402 based on translation of the control body 404 relative to the base 402, and the template chuck 128 rotates relative to the base 402 based on rotation of the control body 404 relative to the base 402. In some examples, the template chuck 128 and the control body 404 are the same component, or are integrated to one component.

In some implementations, the base 402 is coupled to another body of the imprint lithography system 100 such as a wafer stage bridge (not shown). The base 402 serves as a reference structure for translation and rotation of the control body 404 and provides structural support for components that are coupled to the base 402. The base 402 may have an angular (e.g., triangular) frame shape that defines an opening in the middle. In some examples, the opening defined in the base 402 receives other components such as template adjustment mechanisms (not shown). The base 402 may further define recesses 416 that are configured to receive at least a portion of the control body 404.

The control body 404 may include a circular portion 502 that is spaced apart from the base 402 and extensions 504 that extend radially from the circular portion 502 and that are coupled to the base 402. For example, as depicted in FIGS. 3 and 4, the base 402 may have a triangular frame shape and define recesses 416 at corner regions of the base 402. The control body 404 may include three extensions 504 that each extend toward one of the recesses 416 and that are coupled to the base 402 by the flexure 410 at the corner regions. In some examples, a surface (e.g., bottom surface) of the base 402 and a surface (e.g., bottom surface) of control body 404 are aligned to a plane that is substantially parallel to the X-Y plane, and the flexure 410 may face each surface of the base 402 and the control body 404 in a state in which the base 402 and the control body 404 are coupled to each other by the flexure 410.

The first set of actuators 406 may include any type of actuators that are configured to generate a first force to translate the control body 404 relative to the base 402 along a first axis (e.g., Z axis in FIG. 1) and to rotate the control body 404 relative to the base 402 about a second axis (e.g., X axis in FIG. 1) perpendicular to the first axis and about a third axis (e.g., Y-axis) perpendicular to the first axis and to the second axis. For example, the first set of actuators 406 may include electromagnetic actuators (e.g., voice coils), piezoelectric actuators, electric motors, pneumonic or hydraulic actuators, and mechanical gears, etc.

In some implementations, the first set of actuators 406 includes a cylindrical type voice coil, as depicted in FIG. 3. In this example, a moving element 418 (e.g., moving coil) is coupled to the control body 404, and a magnet 420 is fixed to the base 402. In other cases, the moving element 418 may be coupled to the base 402, and the magnet 420 may be coupled to the control body 404. Based on an electric current provided to the moving element 418, a magnetic field is generated. This magnetic field causes the moving element 418 to react to a magnetic field of the magnet 420. This reaction of the moving element 418 to the magnetic field the magnet 420 may generate a force that causes the control body 404 to translate relative to the base 402 in a direction parallel to the Z axis, for instance.

The first set of actuators 406 may cause, based on translation of each actuator, rotation of the control body 404 about the X axis or the Y axis as well as translation along the Z axis relative to the base 402. For example, suppose that the first set of actuators 406 may apply a force to each of the extensions 504 of the control body 404 to translate the extensions 504 by displacement vectors Z1, Z2, and Z3 in a Z axis direction relative to the base 402, respectively. In typical cases, based on Z1, Z2, and Z3 having different values (e.g., magnitude or direction) from one another (e.g., Z1≠Z2, Z2≠Z3, and Z1≠Z3), the control body 404 may translate in the Z axis direction as well as rotate (e.g., tip/tilt) about the X axis and/or the Y axis relative to the base 402. In cases where Z1, Z2, and Z3 have a same magnitude and a same direction, the control body 404 may achieve a pure translation in the Z axis direction. In other cases, a pure tip/tilt motion of the control body 404 may be achieved by controlling the vectors Z1, Z2, and Z3 such that a center of the control body 404 stays at a position relative to the base 402.

In some implementations, the first set of actuators 406 includes three first actuators that are arranged about a central axis of the base where the central axis is parallel to the Z axis. For example, as depicted in FIG. 4, the three first actuators are equally spaced about the central axis of the base 402 and configured to independently translate and rotate the control body 404 relative to the base 402. In this case, extension lines L extending from the central axis to the three first actuators are spaced by 120 degrees from each other (i.e., Θ1=Θ2=Θ3=120°. Similarly, in some examples, the second set of actuators 408 includes three second actuators that are arranged about a central axis of the base 402 where the central axis is parallel to the Z axis. The three second actuators are equally spaced about the central axis of the base 402 and configured to independently translate and rotate the control body 404 relative to the base 402. In this case, extension lines L extending from the central axis to the three second actuators are spaced by 120 degrees from each other.

In some implementations, pairs of actuators, in which each pair includes an actuator of the first set of actuators 406 and an actuator of the second set of actuators 408, are arranged about a central axis of the base 402 where the central axis is parallel to the Z axis. Each actuator of the pairs of actuators is configured to independently translate the control body 404 relative to the base 402 and to rotate the control body 404 relative to the base 402. For example, three pairs of actuators, as depicted in FIGS. 3 and 4, are arranged about the Z axis with a spacing of 120 degrees from each other. In this case, the six actuators (i.e., three actuators of the first set of actuators 406 and three actuators of the second set of actuators 408) each independently translate the control body 404 relative to the base 402 and each independently rotate the control body 404 relative to the base 402.

Figure 5:
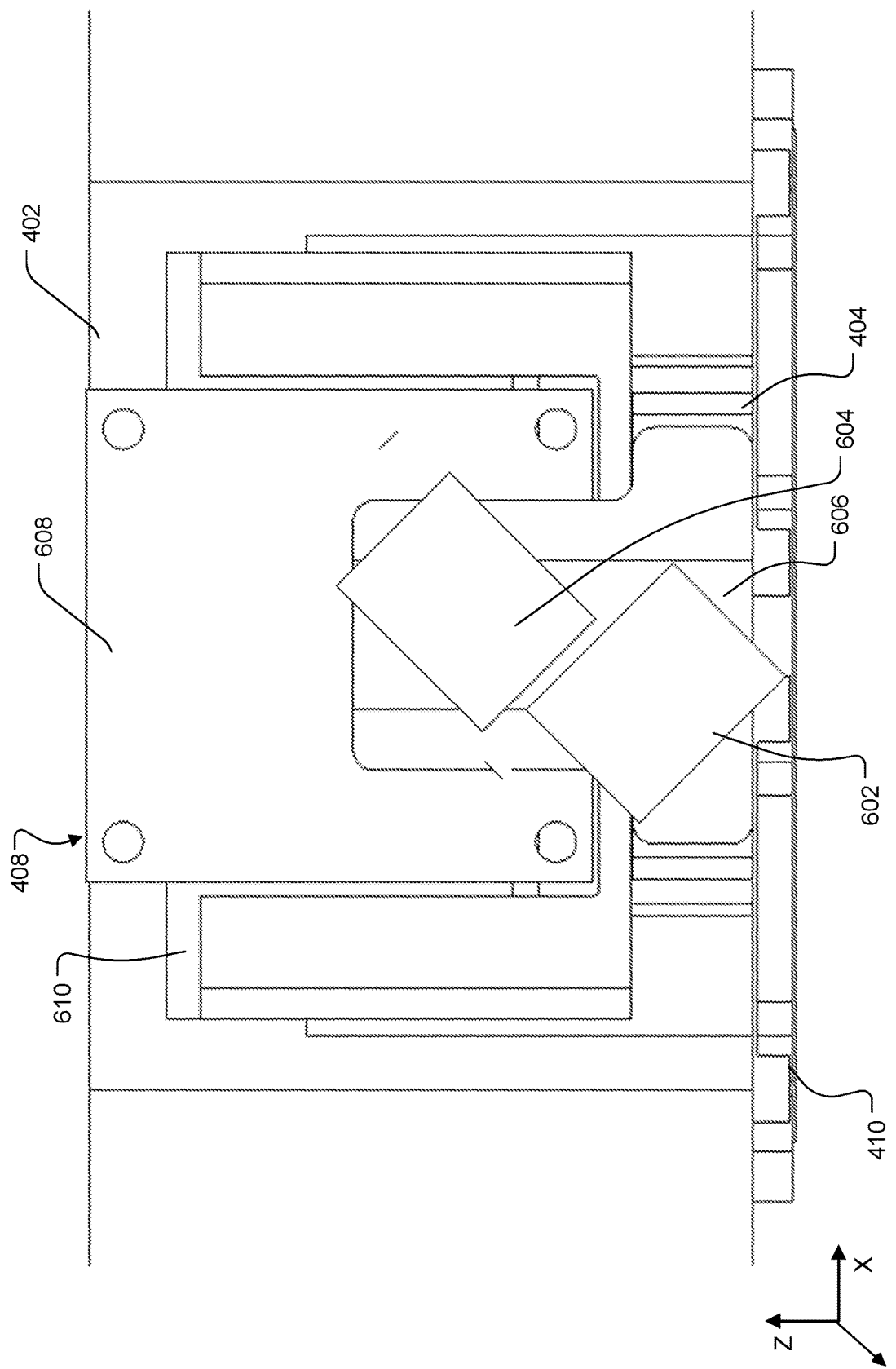
FIG. 5 is a side view of the imprint head module of FIG. 3 without showing an encoder bracket.

Regarding FIG. 5, the second set of actuators 408 may include any type of actuators that are configured to generate a second force to translate the control body 404 relative to the base 402 in a plane (e.g., the X-Y plane) defined by the second axis (e.g., the X axis) and the third axis (e.g., the Y axis) and to rotate the control body relative to the base about the first axis (e.g., the Z axis). For example, the second set of actuators 408 may include a flat type voice coil that includes a flat moving coil 610 coupled to the control body 404 and a flat magnet 608 coupled to the base 402. In some examples, the flat moving coil 610 is coupled to the base 402, and the flat magnet 608 may be coupled to the control body 404. The flat magnet 608 may define a space through which the flat moving coil 610 may translate in a direction parallel to a surface of the flat magnet 608 based on an electric current supplied to the flat moving coil 610. This translation of the flat moving coil 610 relative to the flat magnet 608 may cause the control body 404 to translate in the X-Y plane and rotate about the Z axis relative to the base 402.

For example, if the second set of actuators 408 applies a force to each of the extensions 504 (see FIG. 4) of the control body 404 to translate the extensions 504 by displacement vectors X1, X2, and X3 in the X-Y plane, respectively, relative to the base 402, based on magnitudes and directions of the vectors X1, X2, and X3, the control body 404 may translate in the X-Y plane and rotate about the Z axis (Rz) relative to the base 402. Based on a resultant vector of the displacement vectors X1, X2, and X3, the control body 404 may translate in any direction in the X-Y plane and rotate about the Z axis relative to the base 402. In some examples, a pure rotational motion of the control body 404 is achieved by controlling the displacement vectors X1, X2, and X3 such that a center of the control body 404 stays at a position and serve as an axis of the pure rotational motion of the control body 404 relative to the base 402.

In some implementations, the imprint head 130 further includes a plurality of encoder units 414 (see FIG. 3) that are coupled to the base 402 and to the control body 404. In some examples, the encoder units 414 are coupled to encoder brackets 412 that are coupled to the base 402. Each encoder unit is configured to assess a first displacement of the control body 404 relative to the base 402 along the Z axis and a second displacement of the control body 404 relative to the base 402 in the plane (e.g., the X-Y plane) defined by the X axis and the Y axis.

In some implementations, as depicted in FIG. 5, each encoder unit 414 includes multiple encoders 602, 604, each coupled to the base 402 (e.g., encoder bracket 412), and an encoder scale 606 that is coupled to the control body 404. The encoders 602, 604 are configured to emit light toward the encoder scale 606 and receive diffracted light from the encoder scale 606. For example, the encoder scale 606 may include an optical grating configured to diffract light emitted by the encoders 602, 604 based on a period of the optical grating and a wavelength of the light. The encoders 602, 604 may detect the diffracted light through an optical sensor such as a photovoltaic cell to assess the first displacement of the control body 404 relative to the base 402 along the Z axis and the second displacement of the control body 404 relative to the base 402 in the X-Y plane.

Figure 6:
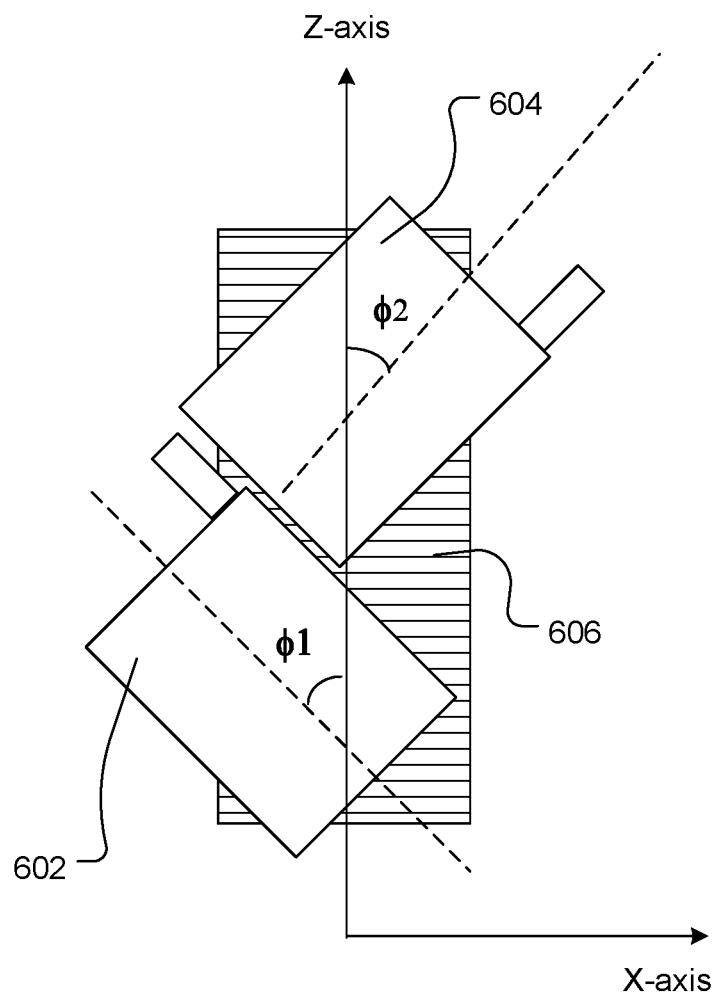
FIG. 6 depicts an arrangement of encoders of FIG. 5 inclined with respect to an axis.

FIG. 6 illustrates an example arrangement of encoders 602, 604 of FIG. 5, showing the encoders 602, 604 that are inclined with respect to an axis and that are placed over the encoder scale 606. In this example, the two encoders 602 and 604 are inclined with respect to the Z axis by an angle $\Phi 1$ and $\Phi 2$, respectively. For example, each angle $\Phi 1$ and $\Phi 2$ may be 45 degrees with respect to the Z axis. The inclined arrangement may be implemented using only one encoder scale 606, which may help to reduce an assembly size of the encoder units. The encoder scale 606 may include an optical grating for each of the encoders 602 and 604, and the optical gratings may be inclined with respect to the Z axis by the angle $\Phi 1$ and $\Phi 2$, respectively, corresponding to orientations of the encoders 602 and 604. In addition, the inclined arrangement may provide a large vertical detection range in a direction parallel to the Z axis and a large horizontal detection ranges in a direction parallel to the X-Y plane. The inclined arrangement may provide a vertical detection range within a length of the encoder scale 606 in the Z direction, and a horizontal detection range within ±1 mm. The vertical detection range, for instance, may correspond to the length of the encoder scale 606 minus a vertical center to center distance between the encoders 602 and 604 (e.g., between the encoder optical sensor locations). In some cases, the two encoders 602 and 604 are implemented with two separate encoder scales that are oriented orthogonal to each other.

FIGS. 7A and 7B illustrate an example flexure 410 of FIG. 4 that couples the control body 404 to the base 402. FIG. 7A is a top view of the flexure 410, and FIG. 7B is a side view of the flexure 410. A compliance of the flexure 410 may correspond to a displacement of the control body 404 relative to the base 402 in response to at least one of the first force from the first set of actuators 406 and the second force from the second set of actuators 408. The flexure 410 may restrict translation and rotation of the control body with respect to the base 402. In some examples, the flexure 410 selectively restricts translation and rotation of the control body with respect to the base 402 according to a direction of the translation and rotation. For example, the flexure 410 may be less compliant (stiffer) in a direction parallel to the X-Y plane and more compliant in a direction parallel to the Z axis.

The flexure 410 may be arranged in a plane perpendicular to the Z axis and may include a surface that is parallel to the plane perpendicular to the Z axis and that faces the base 402 and the control body 404. For example, the flexure 410 may include end portions 702 that are coupled to a surface of the base 402, a middle portion 704 that is located between the end portions 702 and that is coupled to a surface of the control body 404, and connection portions 706 that are each coupled to the middle portion 704 and one of the end portions 702. In some examples, a width W2 of each connection portion is less than a width W1 of each end portion and less than a width W3 of the middle portion in the plane perpendicular to the Z axis.

In some implementations, each end portion 702 of the flexure 410 defines one or more openings 708 (e.g., slits) configured to provide at least a portion of the compliance. Each end portion 702 may include a first portion 7022 coupled to a surface of the base 402 and a second portion 7024 located between the first portion 7022 and one of the connection portions 706. The opening 708 may be defined in the second portion 7024 of the end portion 702. A thickness T2 of the second portion 7024 is less than a thickness T1 of the first portion 7022 in a direction parallel to the Z axis. The middle portion 704 includes a protrusion 7042 extending parallel to the Z axis between recesses 7044 and coupled to a surface of the control body 404. A thickness T3 of the middle portion 704 at a position where the recesses 7044 is defined is less than a thickness T4 of the protrusion 7042 in the direction parallel to the Z axis.

The flexure 410 may provide a selective compliance to the imprint head 130 based on a structural design of the flexure 410 (e.g., the various widths and thicknesses, openings, recesses, protrusions), an arrangement of the flexure 410, and material properties of the flexure 410. For example, the flexure 410 may include a first component of the compliance corresponding to a displacement of the control body 404 relative to the base 402 along the Z axis in response to a first force applied by the first set of actuators 406 in a Z direction, and a second component corresponding to a displacement of the control body relative to the base 402 in the plane defined by the X axis and the Y axis in response to a second force applied by the second set of actuators 408.

In some examples, the first component of the compliance exceeds the second component of the compliance. That is, the flexure 410 may allow a larger motion range in the Z direction (e.g., Z translation, Rx, and Ry) than a motion range in the X-Y plane (e.g., X translation, Y translation, and Rz). For example, the flexure 410 allows a motion range of the control body 404 relative to the base 402 within: ±1 mm Z translation, ±1.4 mrad Rx and Ry, +/−0.01 mm X and Y translations, and ±0.25 mrad Rz. In this example, the motion range in the Z direction is 100 times greater than the motion range in the X and Y directions. Based on the selectively compliant flexure 410, the force required to move the imprint head 130 a distance in the Z direction may be less than the force required to move the imprint head 130 the same distance in the X-Y plane. In other words, a Z stiffness of the flexure 410, the inverse of the compliance in the Z direction, may be less than an XY stiffness. The low Z stiffness may allow a motion range larger in the Z direction than in the XY directions. In some examples, the Z, Rx, Ry motion ranges are determined by an imprint process motion range, and the X, Y, and Rz motion ranges are determined by an alignment correction range. The imprint motion process may be performed before the template 108 contacts the imprint resist on the substrate 102, and the alignment process may be performed when the template 108 is in liquid contact with the imprint resist on the substrate 102. In other examples, the imprint process may make an initial contact between the template 108 and the imprint resist, and then the alignment process starts after the initial contact. In some cases, the X, Y, and Rz motions may be only desired or necessary during the alignment process. The high XY stiffness of the flexure 410 may maintain the imprint head 130 (e.g., the control body 404) within a range that the encoder unit 414 can detect the control body 404, for example, when the imprint head 130 is powered down or performs a homing operation in which the imprint head 130 moves to a predetermined reference position or home position. Additionally, the high XY stiffness of the flexure 410 may improve an overall system dynamics such as a bandwidth of the system 100 or the imprint head 130.

In some implementations, the imprint lithography system 100 further includes one or more additional sensors that are configured to assess a template placement error of the template 108 relative to the control body 404. In this case, the first and second sets of actuators 406, 408 can be further configured to translate and to rotate the control body 404 based on the template placement error of the template 108 relative to the control body 404. For example, the additional sensors can measure movement (e.g., slippage) of the template 108 relative to the template chuck 128 which may be caused by the magnification actuator. The movement of the template 108 relative the template chuck 128 (the template placement error) measured by the additional sensors, may be corrected before an in-liquid alignment process begins to reduce the initial alignment error between the template 108 and substrate 102. In this case, the additional sensors may reduce alignment time and increase throughput. As another example, a foreign material or particle may be introduced between the template 108 and template chuck 128 during production, which may cause a template placement error (e.g., a tilt) of the template 108 relative to the control body 404. The additional sensors may assess this template placement error, and the first and second sets of actuators 406, 408 may correct the template placement error as well as adjust an alignment error between the template 108 and the substrate 102.

Figure 8:
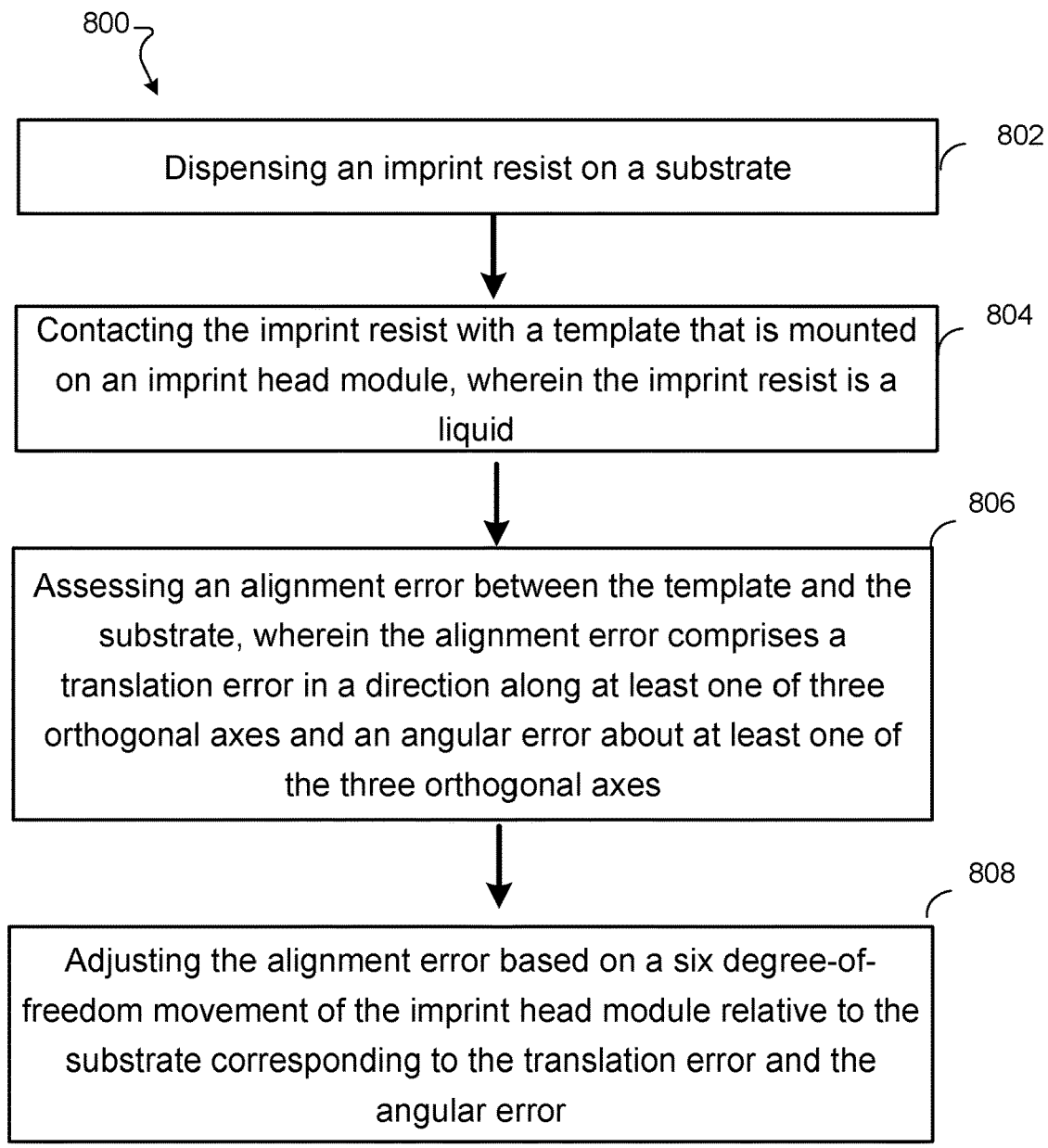
FIG. 8 is a flowchart for a process for correcting an alignment error between a substrate and a template utilizing an imprint head module capable of a six degrees-of-freedom movement.

FIG. 8 is a flowchart for an example process 800 for correcting an alignment error between a substrate and a template, utilizing an imprint head 130 that is capable of a six degrees-of-freedom movement. In 802, an imprint resist is dispensed on a substrate (e.g., an imprint field of a substrate). In 804, the imprint resist is contacted with a template that is mounted on an imprint head module, where the imprint resist is a liquid. The template includes an alignment mark, and the substrate includes an alignment mark that corresponds to the alignment mark of the template. In 806, an alignment error between the template and the substrate is assessed based on a distance or an angle between the alignment marks. For instance, the alignment error may include a translation error in a direction along at least one of three orthogonal axes and an angular error about at least one of the three orthogonal axes. In 808, the alignment error is adjusted based on a six degrees-of-freedom movement of the imprint head module relative to the substrate corresponding to the translation error and the angular error.

In some implementations, the adjustment includes an in-plane adjustment to correct a translation error in the XY plane and a rotation error about the Z axis (Rz), and an out-of-plane adjustment to correct a translation error in the Z direction or rotation errors about the X and Y axes (Rx and Ry). The out-of-plane adjustment may be performed before the template contacts the imprint resist on the substrate to orient the template 108 relative to the substrate 102. The first set of actuators may perform this out-of-plane adjustment. The in-plane adjustment may be performed when the template is in liquid contact with the imprint resist after completion of the out-of-plane adjustment. The second set of actuators may perform this in-plane adjustment.

In some examples, all alignment adjustments can be made by the imprint head to decouple the alignment adjustment from a stage movement. In other examples, the alignment error may be adjusted by a movement of the stage 106 relative to the template, the six degrees-of-freedom movement of the imprint head 130 relative to the substrate, or both. For example, the stage 106 may perform a coarse alignment to adjust a relatively large or initial alignment error, and the imprint head 130 may perform a fine alignment to adjust a remaining alignment error after the coarse alignment. In some cases, the stage 106 and the imprint head 130 are driven together to increase an alignment speed. For example, if an alignment error includes a translation error by 100 nm, the stage 106 may be driven to move the substrate 50 nm in a first direction, and the imprint head 130 may be driven to move the template 50 nm in a second direction opposite the first direction to meet an alignment condition quickly.

In some implementations, the alignment error is adjusted by determining an axis of the three orthogonal axes corresponding to the angular error and by adjusting the angular error by rotating the imprint head about the determined axis. For example, the alignment error may be decomposed into parameters including components for translations X, Y, and Z and rotations Rx, Ry, and Rz. Based on the parameters, the translational error and the angular error may be adjusted by the six degrees-of-freedom movement of the imprint head 130.

In examples where the imprint lithography system 100 further includes one or more displacement sensors that are configured to assess a template placement error of the template relative to the control body, the template placement error may be assessed and adjusted before adjusting the alignment error between the template and the substrate. In other examples, the template placement error may be adjusted as an alignment error without a separate process of adjusting the template placement error.

A number of implementations have been described. Nevertheless, it will be understood that various modifications may be made without departing from the spirit and scope of the disclosure. Accordingly, other implementations are within the scope of the following claims.

What is claimed is:

1. A head module of an imprint lithography system, the head module comprising:
a base having a bottom surface parallel to a plane defined by a second axis and a third axis perpendicular to the second axis;
a control body coupled to the base and configured to translate and to rotate relative to the base, the control body having a bottom surface aligned with the bottom surface of the base;
a first set of actuators operatively coupled to the base and to the control body, wherein the first set of actuators is configured to generate a first force to translate the control body relative to the base along a first axis and to rotate the control body relative to the base about the second axis perpendicular to the first axis and about the third axis perpendicular to the first axis and to the second axis;
a second set of actuators operatively coupled to the base and to the control body, wherein the second set of actuators is configured to generate a second force to translate the control body relative to the base in the plane defined by the second axis and the third axis and to rotate the control body relative to the base about the first axis; and a flexure coupling the base and the control body, wherein a compliance of the flexure corresponds to a displacement of the control body relative to the base in response to at least one of the first force and the second force, and the flexure is configured to restrict translation and rotation of the control body with respect to the base,
wherein the flexure is configured to allow a larger range of motion of the control body along the first axis than a range motion of the control body along the plane defined by the second axis and the third axis.

2. The head module according to claim 1, wherein the compliance of the flexure comprises:
a first component corresponding to a displacement of the control body relative to the base along the first axis in response to the first force, and
a second component corresponding to a displacement of the control body relative to the base in the plane defined by the second axis and the third axis in response to the second force.

3. The head module according to claim 2, wherein the first component of the compliance exceeds the second component of the compliance.

4. The head module according to claim 1, wherein the flexure comprises:
end portions coupled to a surface of the base;
a middle portion located between the end portions and coupled to a surface of the control body; and
connection portions, each connection portion coupled to the middle portion and one of the end portions, and
wherein a width of each connection portion is less than a width of each end portion and less than a width of the middle portion in a plane perpendicular to the first axis.

5. The head module according to claim 4, wherein each end portion defines an opening configured to provide at least a portion of the compliance,
wherein each end portion comprises:
a first portion coupled to the surface of the base; and
a second portion located between the first portion and one of the connection portions, wherein the second portion defines the opening,
wherein a thickness of the second portion is less than a thickness of the first portion in a direction parallel to the first axis, and
wherein the middle portion comprises a protrusion extending parallel to the first axis between recesses, and the protrusion is coupled to the surface of the control body.

6. The head module according to claim 1, wherein the first set of actuators comprises three first actuators arranged about a central axis of the base, wherein the central axis is parallel to the first axis.

7. The head module according to claim 6, wherein the three first actuators are spaced about the central axis of the base and configured to independently translate and rotate the control body relative to the base.

8. The head module according to claim 1, wherein the second set of actuators comprises three second actuators arranged about a central axis of the base, wherein the central axis is parallel to the first axis.

9. The head module according to claim 8, wherein the three second actuators are spaced about the central axis of the base and configured to independently translate and to rotate the control body relative to the base.

10. The head module according to claim 1, wherein the actuators are in pairs, each pair comprising an actuator of the first set of actuators and an actuator of the second set of actuators, are arranged about a central axis of the base, wherein the central axis is parallel to the first axis, and
wherein each actuator of the pairs of actuators is configured to independently translate the control body relative to the base and to rotate the control body relative to the base.

11. The head module according to claim 1, wherein each actuator of the first and second sets of actuators comprises a voice coil configured to generate a force based on an electric current supplied to each actuator, and
wherein the voice coil comprises:
a moving coil coupled to one of the control body and the base, and
a magnet coupled to the other of the control body and the base.

12. The head module according to claim 1, further comprising a plurality of encoder units coupled to at least one of the base or the control body,
wherein each encoder unit is configured to assess a first displacement of the control body relative to the base along the first axis and a second displacement of the control body relative to the base in the plane defined by the second axis and the third axis.

13. The head module according to claim 12, wherein each encoder unit comprises encoders coupled to the base, arranged in a plane parallel to the first axis, and inclined with respect to the first axis.

14. The head module according to claim 13, wherein each encoder unit comprises an encoder scale coupled to the control body,
wherein the encoders are configured to emit light toward the encoder scale and to receive diffracted light from the encoder scale,
wherein the encoder scale comprises an optical grating configured to diffract the light emitted by the encoder unit based on a period of the optical grating and a wavelength of the light, and
wherein each encoder unit is configured to assess the first displacement and the second displacement of the control body relative to the base based on the diffracted light from the optical grating.

15. The head module according to claim 1, wherein the control body is configured to retain an imprint lithography template,
wherein the first set of actuators is further configured to translate and to rotate the control body relative to the base to cause the imprint lithography template to contact a substrate, and
wherein the second set of actuators is further configured to translate and to rotate the control body relative to the base to align the imprint lithography template to the substrate.

16. The head module according to claim 15, further comprising one or more displacement sensors configured to assess a template placement error of the imprint lithography template relative to the control body,
wherein the first and second sets of actuators are further configured to translate and to rotate the control body based on the template placement error of the imprint lithography template relative to the control body.

17. An imprint lithography system comprising:
a substrate stage configured to retain a substrate;
an imprint head module configured to retain a template and to translate the template relative to the substrate, the imprint head module comprising:

a base having a bottom surface parallel to a plane defined by a second axis and a third axis perpendicular to the second axis;
a control body coupled to the base and configured to translate and to rotate relative to the base, the control body having a bottom surface aligned with the bottom surface of the base;
a first set of actuators operatively coupled to the base and to the control body, wherein the first set of actuators is configured to generate a first force to translate the control body relative to the base along a first axis and to rotate the control body relative to the base about the second axis perpendicular to the first axis and about the third axis perpendicular to the first axis and to the second axis;
a second set of actuators operatively coupled to the base and to the control body, wherein the second set of actuators is configured to generate a second force to translate the control body relative to the base in the plane defined by the second axis and the third axis and to rotate the control body relative to the base about the first axis; and
a flexure coupling the base and the control body, wherein a compliance of the flexure corresponds to a displacement of the control body relative to the base in response to at least one of the first force and the second force, and the flexure is configured to restrict translation and rotation of the control body with respect to the base,
wherein the flexure is configured to allow a larger range of motion of the control body along the first axis than a range of motion of the control body along the plane defined by the second axis and the third axis.

* * * * *